United States Patent
Uramoto

(10) Patent No.: US 6,278,751 B1
(45) Date of Patent: Aug. 21, 2001

(54) RECEIVER FOR DIGITAL VOICE BROADCASTING

(75) Inventor: Yoichi Uramoto, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/302,465

(22) Filed: Apr. 29, 1999

(30) Foreign Application Priority Data

May 1, 1998 (JP) .................................... 10-122143

(51) Int. Cl.[7] .............. H04L 27/08; H03G 3/00
(52) U.S. Cl. ................. 375/345; 381/109; 381/86
(58) Field of Search ..................... 381/104, 106, 381/107, 109, 86; 375/316, 345

(56) References Cited

PUBLICATIONS

Sekine, Koji, Method of Controlling Dynamic Range of Digital Audio Broadcasting Receiver, European Patent 855 793 A2.*

* cited by examiner

Primary Examiner—Forester W. Isen
Assistant Examiner—Brian Tyrone Pendleton
(74) Attorney, Agent, or Firm—Jay H. Maioli

(57) ABSTRACT

A digital audio receiver provides an audio signal line of the receiver with a DRS circuit for compressing a dynamic range of audio signals passing through the audio signal line; and the DRS circuit, provides a control section for controlling gains for said audio signals in accordance with dynamic range control (DRC) data sent from broadcasting stations, thus enabling dynamic range control functions without circuit complication.

3 Claims, 2 Drawing Sheets

RECEIVER FOR DIGITAL VOICE BROADCASTING

BACKGROUND OF THE INVENTION

1. Field of the Invention

The present invention relates to a receiver for digital voice broadcasting.

2. Description of Related Art

Recently, it has been proposed that voice broadcasting should be digitalized, that is, a voice information signal is sent as a digital voice information signal to improve the quality of voice information. In particular, digital voice broadcasting, that is, digital voice broadcasting (DAB) complying with the Eureka 147 standard has already been made to fit for practical use in European areas.

The DAB is provided with a function to allow broadcasting stations to control the gain of an audio signal line in a receiver.

This function is called DRC (dynamic range control). To implement the DRC, broadcasting stations send control data called DRC data together with the original voice data. That is, a two-byte area called F-PAD is provided at the end of frames of digital voice data, and DRC data, placed therein, is sent. For example, in the case of mode II, since a frame cycle is 24 ms, DRC data is sent every 24 ms.

The DRC data is 6 bits in size and the relationship between the DRC data and the gain of an audio signal line is as shown below.

```
DRC data  Gain
000000:0 dB (reference gain)
000001:+0.25 dB
000010:+0.50 dB
000011:+0.75 dB
...  ← Incremented every 0.25 dB step in this section
111111:+15.75 dB
```

Incremented every 0.25 dB step in this section 111111:+15.75 dB

That is, if "000011" is sent as DRC data from a broadcasting station, the gain of an audio signal line is increased by 0.75 dB, so that the level of an audio signal becomes 0.75 dB higher than a user-specified level.

Accordingly, a DAB receiver can, by performing DRC processing using a Digital Signal Processor (DSP), offer music broadcasts excellent in dynamics, one of audio effects. Also, even inexpensive DSPs can be expected to offer the same effect as brought about by an effector using an advanced DSP.

DRC having the above described functions and effects is effective, for example, when enjoying music in noisy environments such as inside a running car.

However, for example, in the case of a running car, DRC intended by a broadcasting station and listener-desired DRC may differ depending on running environments, such as running on a general road or autobahn, car type, and weather (fine or rainy). Also, DRC data may not be contained in a broadcast itself.

Accordingly, a DSP for DRC processing, provided in a DAB receiver, may merely make the receiver more costly and provide no significant effects.

SUMMARY OF THE INVENTION

The present invention intends to solve such a problem.

For this reason, the present invention offers a receiver for digital voice broadcasting which provides an audio signal line with a DRS circuit for compressing a dynamic range of audio signals passing through the audio signal line, and in the DRS circuit, controls gains for the audio signals in accordance with DRC data sent from broadcasting stations.

Accordingly, DRC processing is performed in the DRS circuit.

DETAILED DESCRIPTION OF THE PREFERRED EMBODIMENTS

Functions called DRS (dynamic range suppression) are available as audio effector functions. The DRS functions compress a dynamic range of audio signals, and the DRS circuit has input-output characteristics shown in FIG. 3, for example.

That is, when DRS is set to a minimum (0), input-output characteristics thereof are shown by characteristic Amin and exhibit a transmission line with a gain of 0 dB. However, when DRS is set to a maximum, input-output characteristics thereof are shown by characteristic Amax; when an input level is lower than a defined value −30 dB, an output level becomes 15 dB higher than the input level, and when an input level is higher than −30 dB, an output level is constant to −15 dB. Furthermore, when DRS is set between the maximum and the minimum, input-output characteristics thereof, which are shown by characteristics A1 to A5, become characteristics intermediate between the characteristics Amin and Amax.

Accordingly, for example, with the characteristic Amin usually set, by setting an arbitrary characteristic of A1 to Amax in accordance with increasing levels of ambient noise, users can comfortably enjoy music and other sounds.

The present invention, focusing attention on this point, uses the DRS characteristics to obtain DRC functions. Hereinafter, an embodiment of the present invention will be described with reference to FIG. 1.

Figure 1:
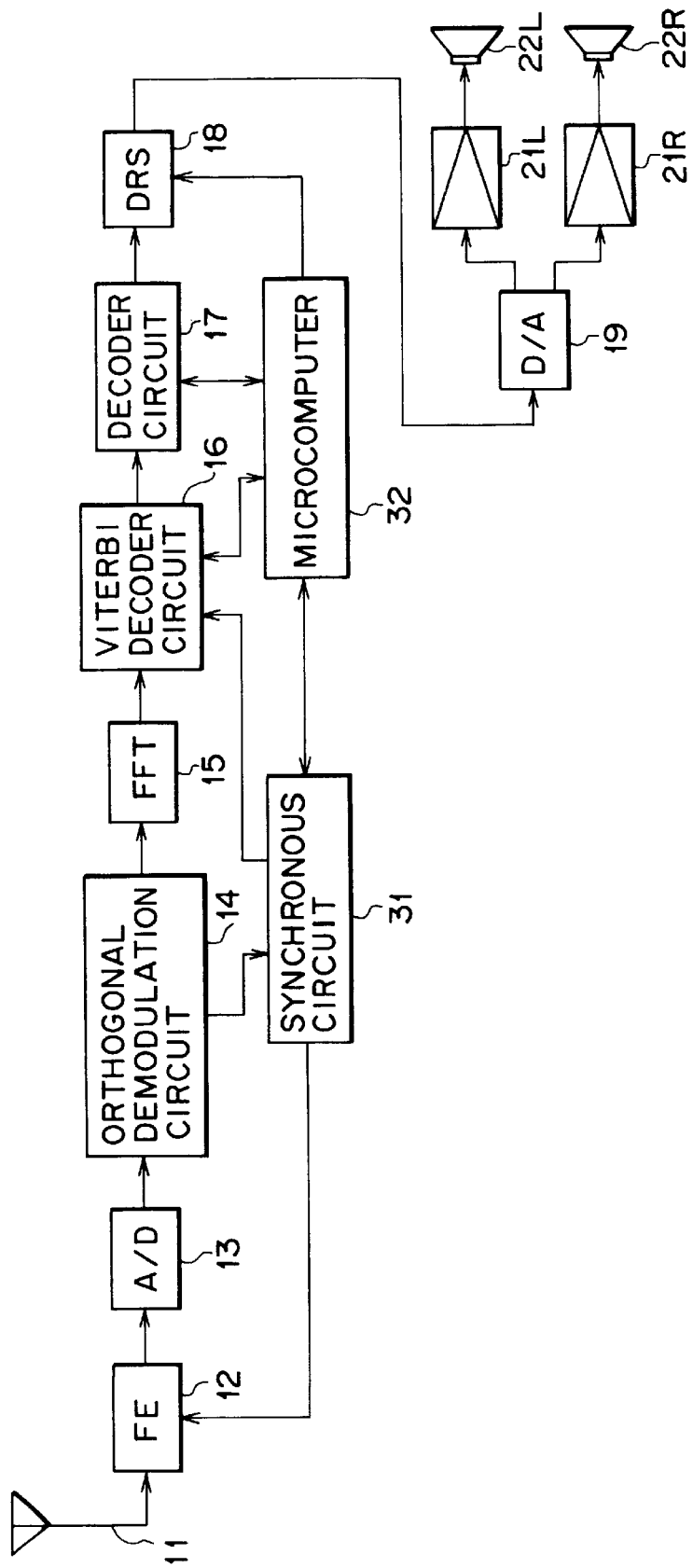
FIG. 1 is a system diagram showing one embodiment of the present invention.

In FIG. 1, a DAB broadcast wave signal is received by antenna 11, and the received signal is supplied to a front end circuit 12 configured in super-heterodyne form and converted into an intermediate frequency signal, which is supplied to an A/D converter circuit 13, resulting in a digital signal.

The digital signal is supplied to orthogonal demodulation circuit 14 in which signals of I and Q components of base band are demodulated and supplied to FFT circuit 15 to be subjected to OFDM demodulation. The OFDM-demodulated data is supplied to Viterbi decoder circuit 16 in which it is deinterleaved and subjected to error correction, and a program (channel) is selected and digital audio data of the desired program is selected.

The selected data is supplied to audio decoder circuit 17 in which it is subjected to decode processing such as data extension, and audio data of a desired program is fetched from the decoder circuit 17. The fetched digital audio data is supplied to D/A converter circuit 19 through DRS circuit 18 described later and is subjected to D/A conversion into analog audio signals of left and right channels. These signals are supplied to speakers 22L and 22R through amplifiers 21L and 21R.

Furthermore, with synchronous circuit 31 provided for synchronous control, signals of I and Q components are supplied to the synchronous circuit 31 from the orthogonal demodulation circuit 14 to form a correction signal for frequency synchronization, and the correction signal is supplied to the front end circuit 12 and the Viterbi decoder circuit 16. Predetermined signals are accessed between microcomputer 32, provided for system control, and the synchronous circuit 31, and also among circuits 16 to 18.

Figure 2:
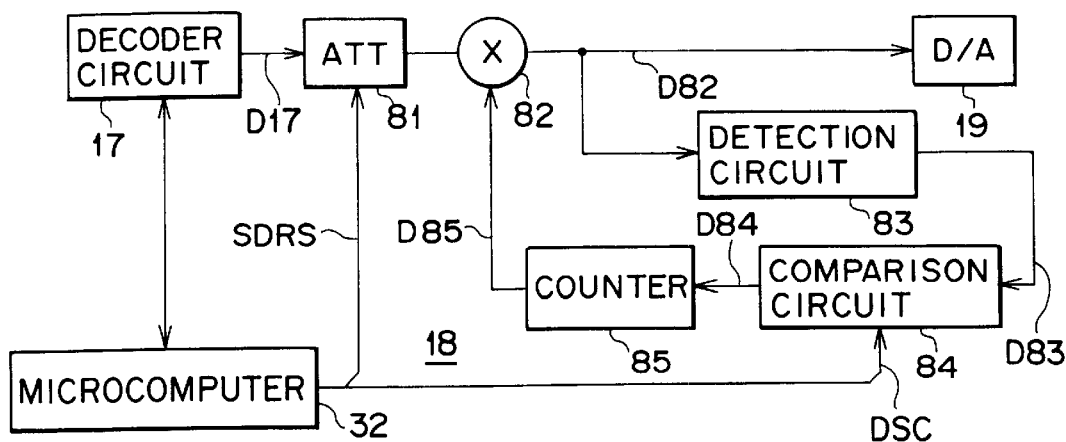
FIG. 2 is a system diagram for explaining the present invention.

The DRS circuit 18, including a DSP, for example, is provided with DRC functions, and processing contents thereof are as shown in FIG. 2, for example, if represented by discrete circuits. In FIG. 2, DRS functions providing a constant output level are omitted for simplicity.

That is, digital audio data D17 output from the decoder circuit 17 is supplied to variable attenuator circuit 81 to produce digital audio data D81 of a predetermined level, the data D81 is supplied to multiplying circuit 82 and multiplied by a predetermined multiplier to produce digital audio data D82, and the data D82 is supplied to the D/A converter circuit 19.

In the microcomputer 32 to which DRS characteristic specification keys are connected via the interface, control signal SDRS changing according to user-specified DRS characteristics is formed, the signal SDRS is supplied to the attenuator circuit 81 as a control signal thereof, and the attenuator circuit 81 causes attenuation by an amount determined by the signal SRDS.

Furthermore, data D82 from the multiplying circuit 82 is supplied to level detection circuit 83 in which data D83 indicating the average level of data D82 is fetched, and the data D83 is supplied to comparison circuit 84.

DRC data DDRC is fetched from the decoder circuit 17 and supplied to the microcomputer 32, and when GDRS and GDRC are defined as follow:

GDRS: Gain increased from a reference gain by DRS processing. That is, an increased value [dB] from the level of the characteristic Amin in the slant portion of FIG. 3

GDRC: Gain indicated by DRC data (increased value from a reference gain) [dB], data DSC is formed so that gain GSC satisfies the following relation:

$$GSC = GDRS + GDRC \quad (1)$$

The data DSC is supplied to the comparison circuit 84, from which comparison output D84 is fetched that goes High when D83<DSC, and Low when D83≧DSC.

The output signal D84 is supplied to up-down counter 85 as a switching control signal for up-count and down-count, and a clock is input to counter 85 as count input. The counter 85 is incremented when D84 is High, and decremented when Low. A counted value D85 of the counter 85 is supplied to the multiplying circuit 82 as a multiplier and multiplied by the data D81.

Accordingly, although a multiplication D82=D81×D85 is performed in the multiplying circuit 82, the counter 85 is incremented when D83<DSC, and decremented when D83≧DSC, so that D83 converges to DSC, at which time the average level of data D82 increases by gain GSC indicated by data DSC. That is, loop gains varying in magnitude depending on the data DSC can be obtained by the circuits 82 to 85.

Accordingly, the gain of the DRS circuit 18 is determined by an attenuation amount of the attenuator circuit 81 and the gain of the multiplying circuit 82, that is, by the signal SDRS and data DSC.

Figure 3:
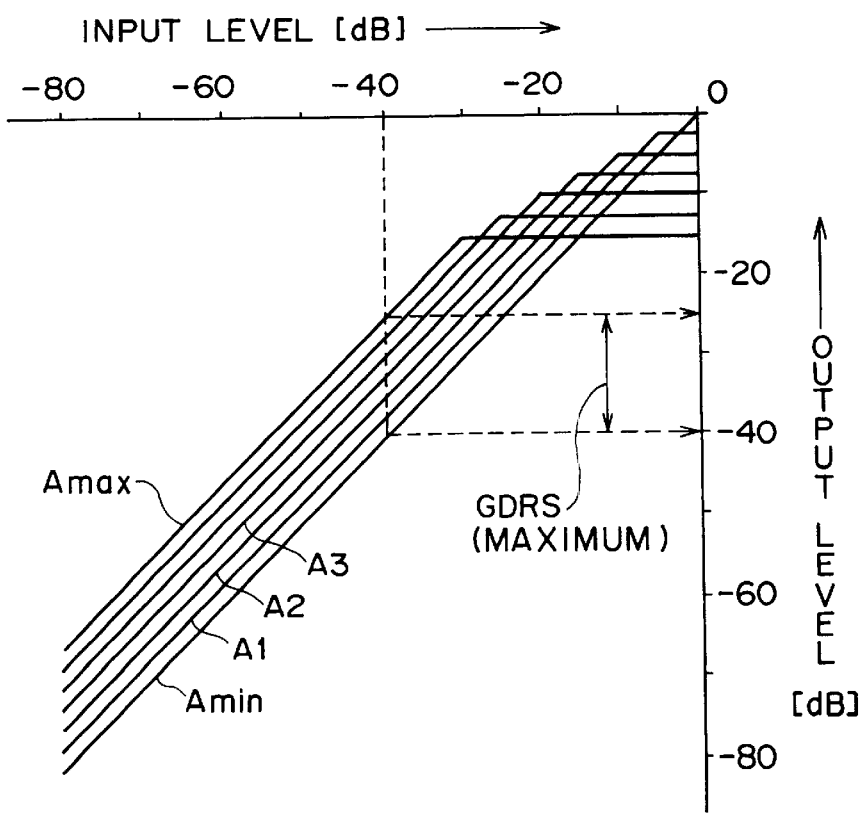
FIG. 3 is a characteristic diagram for explaining the present invention.

When a user specifies, e.g., the characteristic A2 of FIG. 3 as a DRS characteristic, the DRS circuit 18 is set to the characteristic A2. When the gain GDRC of DRC indicated from a broadcast station is larger than the gain of characteristic A2 (such as characteristic A3 to Amax), the characteristic A2 is changed to a characteristic affording the gain GDRC; when smaller than the gain of characteristic Ai, the indicated gain GDRC is ignored.

In other words, when a user specifies the characteristic Ai (Amax≧Ai ≧Amin) of FIG. 3 as a DRS characteristic, the DRS circuit 18 is set to the characteristic Ai. When the gain GDRC of DRC indicated from a broadcast station is larger than the gain of characteristic Ai, the characteristic Ai is changed to a characteristic affording the gain GDRC; when smaller than the gain of characteristic Ai, the indicated gain GDRC is ignored.

Therefore, according to the DRS circuit 18, GRC characteristics can be obtained in accordance with user settings, and if a broadcast station specifies a volume level (gain) by DRC data, at least the specified volume level is ensured. Accordingly, according to the DRS circuit 18, DRS functions and DRC functions can be obtained at the same time by the circuit 18 alone.

In this way, according to the above described DRS circuit 18, since DRC processing is also performed at the same time as DRS processing, even when the level of ambient noise changes greatly, such as inside a running car, DRC characteristics intended by broadcast stations can be obtained. Moreover, since DRC functions are obtained by a DSP for DRS, cost rises can be curbed.

In the foregoing, an intermediate frequency signal from the front end circuit 12 is orthogonally demodulated to obtain signals of I and Q components, and these signals are subjected to A/D conversion before being supplied to the FFT circuit 15.

According to the present invention, DRC characteristics intended by broadcast stations can be obtained even when the level of ambient noise changes greatly, such as inside a running car. Moreover, a rise in receiver costs can be curbed.

What is claimed is:

1. A receiver for digital voice broadcasting comprising:
   a Dynamic Range Suppression (DRS) circuit connected in an audio signal line of the receiver for compressing a dynamic range of audio signals passing through the audio signal line, wherein the DRS circuit includes a control section for controlling gains for said audio signals in accordance with Dynamic Range Control (DRC) data sent from broadcasting stations to the receiver and in accordance with a DRS characteristic selected by a user of the receiver, wherein
   when a gain indicated by the DRS characteristic is less than a gain in accordance with said DRC data, said DRS circuit provides the gain in accordance with said DRC data; and
   when the gain indicated by the DRS characteristic is greater than the gain in accordance with said DRC data, the DRS circuit provides the gain indicated by the selected DRS characteristic and the gain in accordance with said DRC data is ignored, wherein said DRS circuit comprises:

attenuating means connected in the audio signal line for providing the audio signals at a predetermined level determined by a control signal from a microcomputer forming part of the receiver, and said control signal is based on DRS characteristics provided by a user of the receiver;

counting means;

multiplying means for multiplying an output of the attenuating means by an output of said counting means and producing an output of said DRS circuit;

detection means for measuring the output of said multiplying means;

comparing means for comparing a level of an output of said detecting means to DRC data supplied by said microcomputer such that when the level of the input from the detecting means is smaller than the level supplied by the DRC data, the output of the comparing means goes to a predetermined logic state, wherein said counting means counts an output of said comparing means, such that the counting means counts up when the control signal is at said predetermined logic state, with said output of said counting means being supplied to said multiplying means.

2. The receiver for digital voice broadcasting according to claim 1, wherein said DRS circuit is composed of a Digital Signal Processor (DSP).

3. The receiver for digital voice broadcasting according to claim 1, wherein:

said attenuating means includes a variable attenuating circuit;

said counting means includes an up-down counter;

said multiplying means includes a multiplying circuit;

said detection means includes a detection circuit; and said comparing means includes a comparison circuit for comparing a level of the detection circuit output to a level of DRC data received form said microcomputer.

* * * * *